United States Patent
Lin et al.

(10) Patent No.: US 9,334,156 B2
(45) Date of Patent: May 10, 2016

(54) CHIP PACKAGE AND METHOD THEREOF

(71) Applicant: XINTEC INC., Taoyuan (TW)

(72) Inventors: Chien-Min Lin, Taoyuan (TW);
Yu-Ting Huang, Taoyuan (TW);
Chen-Ning Fu, New Taipei (TW);
Yen-Shih Ho, Kaohsiung (TW)

(73) Assignee: XINTEC INC., Taoyuan (TW)

(*) Notice: Subject to any disclaimer, the term of this patent is extended or adjusted under 35 U.S.C. 154(b) by 0 days.

(21) Appl. No.: 14/747,507

(22) Filed: Jun. 23, 2015

(65) Prior Publication Data
US 2016/0039662 A1    Feb. 11, 2016

(30) Foreign Application Priority Data

Aug. 11, 2014    (TW) .............................. 103127488 A

(51) Int. Cl.
| | |
|---|---|
| *B81B 7/00* | (2006.01) |
| *B81C 1/00* | (2006.01) |
| *H01L 21/48* | (2006.01) |
| *H01L 23/498* | (2006.01) |

(52) U.S. Cl.
CPC ............. *B81B 7/007* (2013.01); *B81C 1/00269* (2013.01); *H01L 21/4853* (2013.01); *H01L 21/4857* (2013.01); *H01L 23/49822* (2013.01); *H01L 23/49838* (2013.01)

(58) Field of Classification Search
CPC .............. B81B 7/00; B81B 1/00; B81C 1/00; H01L 21/48; H01L 23/498; H01L 2924/1461; H01L 41/00; H01L 41/1132
See application file for complete search history.

(56) References Cited

U.S. PATENT DOCUMENTS

| | | | | |
|---|---|---|---|---|
| 5,610,431 | A * | 3/1997 | Martin | .................... G01P 1/023 257/415 |
| 7,696,004 | B2 * | 4/2010 | Yuan | ........................ H01L 23/10 257/E21.499 |
| 2005/0167795 | A1 * | 8/2005 | Higashi | ................... B81B 7/007 257/678 |
| 2011/0278734 | A1 * | 11/2011 | Yen | .......................... B81B 7/007 257/774 |

* cited by examiner

*Primary Examiner* — Peniel M Gumedzoe
(74) *Attorney, Agent, or Firm* — Liu & Liu

(57) ABSTRACT

A chip package includes a semiconductor chip, an interposer, a polymer adhesive supporting layer, a redistribution layer and a packaging layer. The semiconductor chip has a sensor device and a conductive pad electrically connected to the sensing device, and the interposer is disposed on the semiconductor chip. The interposer has a trench and a through hole, which the trench exposes a portion of the sensing device, and the through hole exposes the conductive pad. The polymer adhesive supporting layer is interposed between the semiconductor chip and the interposer, and the redistribution layer is disposed on the interposer and in the through hole to be electrically connected to the conductive pad. The packaging layer covers the interposer and the redistribution layer, which the packaging layer has an opening exposing the trench.

19 Claims, 7 Drawing Sheets

CHIP PACKAGE AND METHOD THEREOF

RELATED APPLICATIONS

This application claims priority to Taiwanese Application Serial Number 103127488, filed Aug. 11, 2014, which is herein incorporated by reference.

BACKGROUND

1. Field of Invention

The present disclosure relates to a package and a manufacturing method thereof. More particularly, the present disclosure relates to a chip package and a manufacturing method thereof.

2. Description of Related Art

Along the evolution in the manufacturing technology of the semiconductor devices, the functional density of the semiconductor devices has increased with the decrease of device sizes to achieve higher integration density of the semiconductor devices. Because the improvement of the integration density of the semiconductor devices, the semiconductor industry has experienced rapid growth. As a result, the demands to the packaging technology are becoming severe under the condition of decrease in size and increase in density of the semiconductor devices. In recent years, the demands to the smaller electronic devices have increased, and innovative packaging technology is required for the semiconductor chip.

Stereoscopic semiconductor chip package technology is an effective choice to further decrease a physical size of a semiconductor chip package. In the stereoscopic semiconductor chip package, the semiconductor chips are stacked vertically, and through-silicon via (TSV) technology is applied to achieve electrically connection between these semiconductor chips. Therefore, the wires between the chips are shortened, and the device sizes are reduced. The stereoscopic semiconductor chip package technology is able to integrate semiconductor chips with different functionalities, and thereby effectively increasing efficiency of the products, reducing the volumes, and achieving higher integration density. In other words, the stereoscopic semiconductor chip package technology is able to form higher integration density in smaller form factors, so as to obtain the semiconductor chip package having multi-functionality and high efficiency. Generally, a stereoscopic semiconductor chip package may include a semiconductor chip, an interposer having through-silicon vias and other substrates. The semiconductor chip is adhered at one side of the interposer by solder bumps, which provides electrical connection between the semiconductor chip and the interposer. The other side of the interposer is electrically connected to a printed circuit board or other interposers via solder balls. The through-silicon vias integrate the semiconductor chip and the printed circuit board on opposite sides of the interposer, which the printed circuit board may be substituted by other integrated circuit chips.

Among the integration of the semiconductor chip and the interposer, the solder bumps are formed of specific alloys, and an eutectic bonding method is applied to perform transition between metal phases. The eutectic bonding method is a special diffusion bonding to make the alloys mix and diffuse under a melting point lower than that of any solutes. Thus, a metal interface bonding is formed between the semiconductor chip and the interposer at a lower temperature of about 400° C. to 500° C. However, when performing the eutectic bonding method, the demands on controlling parameters of an annealing process is high, such as temperature and heat cycles, so that small variations of the process easily make solder bumps generate mechanical stress to affect the metal interface bonding. As a result, problems of failure connection and fracture may easily occur on the solder bumps between the semiconductor chip and the interposer. Therefore, a more reliable chip package suitable for mass production and a manufacturing method thereof is one of the important researches in the present semiconductor chip package technology.

SUMMARY

The present disclosure provides a chip package and a manufacturing method thereof. The chip package has a polymer adhesive supporting layer to substitute solder bumps of an eutectic bonding method. Therefore, higher process margin of connecting a semiconductor chip and an interposer in a stereoscopic semiconductor chip package is achieved, which is effectively controlled to ensure the connection of the semiconductor chip and the interposer. In addition, the polymer adhesive supporting layer is effectively formed under a lower temperature compared with the solder bumps of the eutectic bonding method, and thereby reducing a risk of high temperature effect on electronic devices in the chip package. Also, the polymer adhesive supporting layer has lower costs of production, which make the chip package of the present disclosure suitable for mass production.

The present disclosure provides a chip package including a semiconductor chip, an interposer, a polymer adhesive supporting layer, a redistribution layer and a packaging layer. The semiconductor chip has a sensor device and a conductive pad electrically connected to the sensing device, and the interposer is disposed on the semiconductor chip. The interposer has a trench and a through hole, which the trench exposes a portion of the sensing device, and the through hole exposes the conductive pad. The polymer adhesive supporting layer is interposed between the semiconductor chip and the interposer, and the redistribution layer is disposed on the interposer and in the through hole to be electrically connected to the conductive pad. The packaging layer covers the interposer and the redistribution layer, which the packaging layer has an opening exposing the trench.

In various embodiments of the present disclosure, the polymer adhesive supporting layer has an opening through the through hole to expose the conductive pad.

In various embodiments of the present disclosure, the polymer adhesive supporting layer includes a thermal curing material, an ultraviolet curing material, or a combination thereof.

In various embodiments of the present disclosure, the polymer adhesive supporting layer includes epoxy.

In various embodiments of the present disclosure, the sensing device is disposed in an active region of the semiconductor chip, and the conductive pad is disposed in a periphery region of the semiconductor chip, which the periphery region surrounds the active region.

In various embodiments of the present disclosure, the packaging layer does not fully fill the through hole.

In various embodiments of the present disclosure, a conductive external connection is disposed on the interposer, and the conductive external connection is electrically connected to the redistribution layer.

In various embodiments of the present disclosure, the interposer includes a first isolation layer and a second isolation layer. The first isolation layer is disposed at a lower surface of the interposer, and the second isolation layer is disposed at an upper surface of the interposer and at a sidewall of the through hole.

In various embodiments of the present disclosure, a projection of the trench on the semiconductor chip is in at least one side of the active region.

In various embodiments of the present disclosure, the polymer adhesive supporting layer is a polymer dam structure.

The present disclosure provides a method of manufacturing a chip package, and the method includes following steps. A first isolation layer is formed at a lower surface of an interposer, and at least one trench is formed to extend from the lower surface to an upper surface of the interposer. A polymer adhesive supporting layer is formed under the lower surface, and the polymer adhesive supporting layer has an opening. The interposer and a semiconductor chip are bound via the polymer adhesive supporting layer, which the semiconductor chip has at least one sensor device and at least one conductive pad electrically connected to the sensing device, and the opening of the polymer adhesive supporting layer is corresponded to the conductive pad. At least one through hole is formed to extend from the upper surface to the lower surface, and the through hole is through the opening of the polymer adhesive supporting layer to expose the conductive pad. A second isolation layer is formed to cover the upper surface and a sidewall of the through hole, and a redistribution layer is formed on the second isolation layer and in the through hole to be electrically connected to the conductive pad. The interposer is etched to expose the trench at the upper surface, and a packaging layer is formed to cover the redistribution layer, which the packaging layer has an opening exposing the trench.

In various embodiments of the present disclosure, forming the polymer adhesive supporting layer at the lower surface includes following steps. The polymer adhesive supporting layer is coated at the lower surface, and the polymer adhesive supporting layer is photolithography etched to form the opening in the polymer adhesive supporting layer.

In various embodiments of the present disclosure, further includes a step of thinning the interposer from the upper surface to the lower surface. This step is between the step of binding the interposer and the semiconductor chip via the polymer adhesive supporting layer and the step of forming the through hole extending from the upper surface to the lower surface and through the opening of the polymer adhesive supporting layer to expose the conductive pad.

In various embodiments of the present disclosure, forming the packaging layer covering on the redistribution layer includes following steps. The packaging layer is coated on the redistribution layer, and the packaging layer is laser drilled to form the opening in the packaging layer to expose the trench.

In various embodiments of the present disclosure, the packaging layer does not fully fill the through hole during coating the packaging layer on the redistribution layer.

In various embodiments of the present disclosure, the polymer adhesive supporting layer includes a thermal curing material, an ultraviolet curing material, or a combination thereof.

In various embodiments of the present disclosure, the thermal curing material includes epoxy.

In various embodiments of the present disclosure, further includes a step of forming a conductive external connection on the interposer, and the conductive external connection is electrically connected to the redistribution layer.

In various embodiments of the present disclosure, the polymer adhesive supporting layer is a polymer dam structure.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
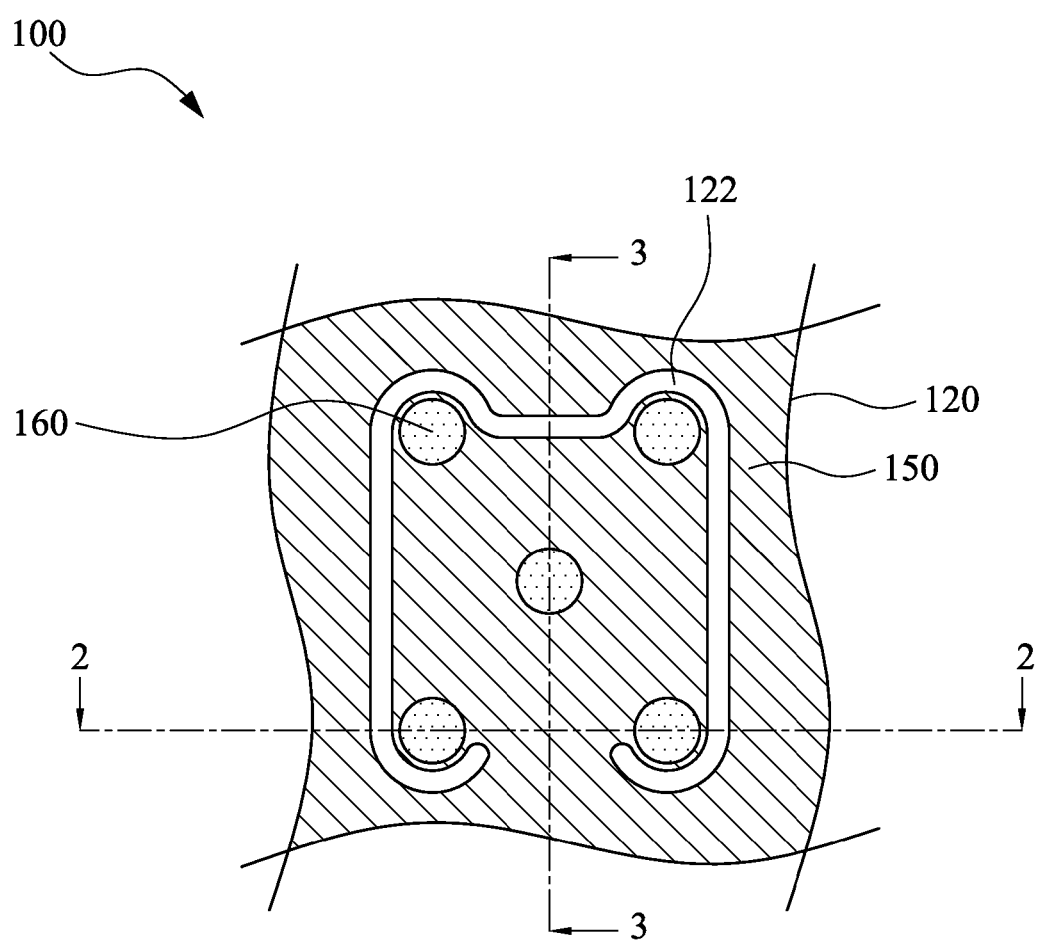
FIG. 1 illustrates a top-view of a chip package according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
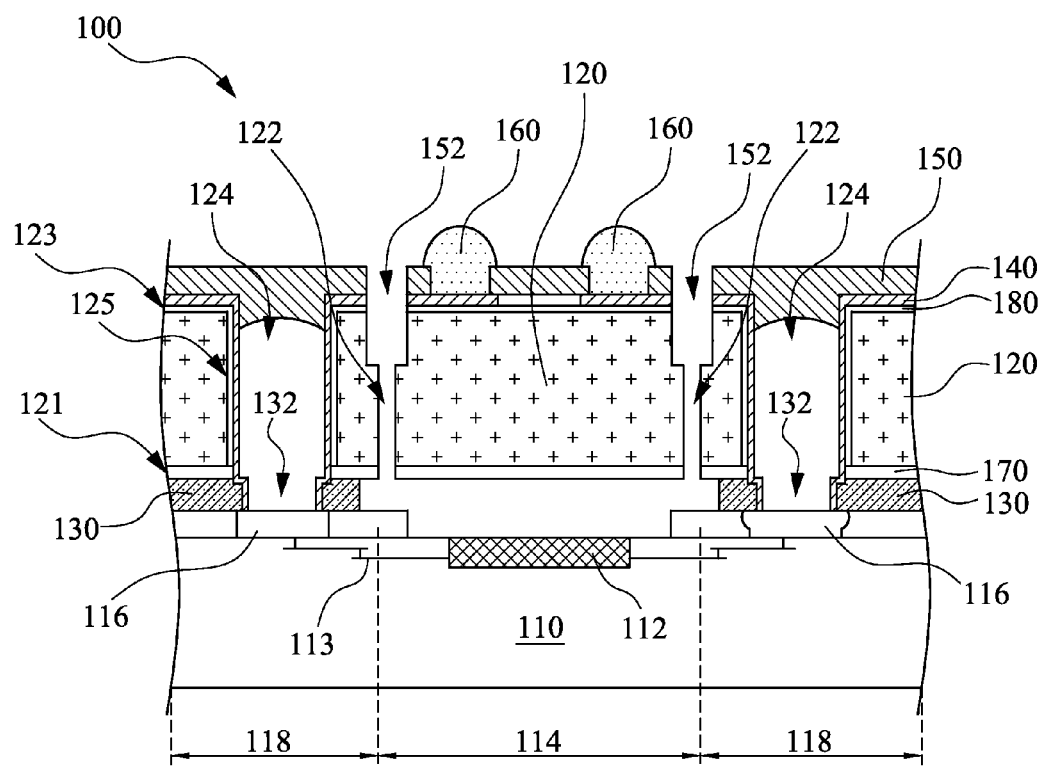
FIG. 2 is a cross-sectional view of the chip package shown in FIG. 1 alone line 2.
Figure 3:
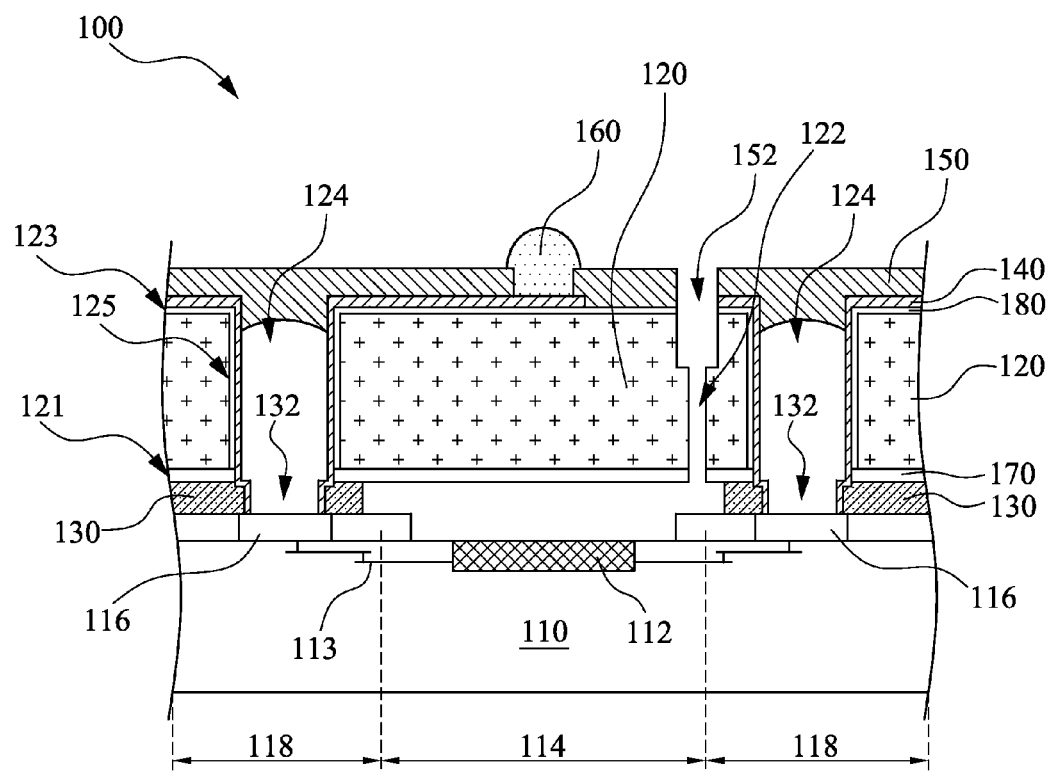
FIG. 3 is a cross-sectional view of the chip package shown in FIG. 1 alone line 3.

FIG. 1 illustrates a top-view of a chip package according to various embodiments of the present disclosure, FIG. 2 is a cross-sectional view of the chip package shown in FIG. 1 alone line 2, and FIG. 3 is a cross-sectional view of the chip package shown in FIG. 1 alone line 3. Referring to FIG. 1-3 at the same time, a chip package 100 includes a semiconductor chip 110, an interposer 120, a polymer adhesive supporting layer 130, a redistribution layer 140 and a packaging layer 150. As shown in FIG. 2 and FIG. 3, the semiconductor chip 110 includes a sensing device 112 and a conductive pad 116. The sensing device 112 is disposed in an active region 114 of the semiconductor chip 110, and the conductive pad 116 is disposed in a periphery region 118 of the semiconductor chip 110, which the periphery region 118 surrounds the active region 114. The conductive pad 116 is electrically connected to the sensing device 112. The semiconductor chip 110 may be a chip formed from a semiconductor wafer including silicon, germanium, or other III-V group elements. The sensing device 112 may include surface acoustic wave (SAW) device, pressure sensors, physical sensors of measuring physical quantity variation, such as heat and pressure, micro electro mechanical systems (MEMS), active elements, passive elements, electronic components of integrated circuits, such as digital circuits or analog circuits, micro fluidic systems, RF circuits, accelerators, gyroscopes or micro actuators, but not limited thereto. As shown in FIG. 2 and FIG. 3, two conductive pads 116 are respectively disposed on left and right sides of the sensing device 112, and the conductive pads 116 are electrically connected to the sensing device 112 via an interconnect structure 113 inside the semiconductor chip 110. The conductive pad 116 in the periphery region 118 of the semiconductor chip 110 is electrically connected to the sensing device 112 in the active region 114 of the semiconductor chip 110. Therefore, the conductive pad 116 acts as a signal control input/output end of the sensing device 112, so as to perform sensing signals control to the sensing device 112 in the semiconductor chip 110. The conductive pad 116 is formed of aluminum, copper, nickel, or other suitable conductive materials.

Referring to FIG. 2 and FIG. 3, the interposer 120 is disposed on the semiconductor chip 110. The interposer 120 includes a trench 122 and a through hole 124, which the trench 122 exposes a portion of the sensing device 112, and the through hole 124 exposes the conductive pad 116. The interposer 120 may be formed of silicon. The trench 122 is through the interposer 120 to expose the sensing device 112 under the interposer 120, so as to generate sensing signals by sensing variation of temperature, pressure or acoustical wave, which the sensing device 112 is in the semiconductor chip 110. In some embodiments, a projection of the trench 122 on the semiconductor chip 110 is in at least one side of the active region 114. As shown in FIG. 1-3, the projection of the trench 122 surrounds three sides of the active region 114, and one side of the active region 114 is remained for connecting, but not limited thereto. Shape and position of the trench 122 could be designed corresponding to different needs; for example, the trench 122 may be a continuous trench or a plurality of small trenches. In addition, as shown in FIG. 2 and FIG. 3, the interposer 120 includes a first isolation layer 170 disposed at a lower surface 121 of the interposer 120, and a second isolation layer 180 is disposed at an upper surface 123 of the interposer 120 and at a sidewall 125 of the through hole 124. The first isolation layer 170 and the second isolation layer 180 are formed by chemical vapor depositing silicon oxide, silicon nitride, silicon oxynitride, or other suitable insulating materials to form an isolation film conformally along the lower surface 121/upper surface 123 of the interposer 120 and the sidewall 125 of the through hole 124. The first isolation layer 170 at the lower surface 121 of the interposer 120 and the second isolation layer 180 at the upper surface 123 of the interposer 120 and at the sidewall 125 of the through hole 124 protect the interposer 120, so as to electrically isolates the interposer 120 and the subsequent redistribution layer 140.

Continuing in FIG. 2 and FIG. 3, the polymer adhesive supporting layer 130 is interposed between the semiconductor chip 110 and the interposer 120. The polymer adhesive supporting layer 130 adheres the semiconductor chip 110 and the interposer 120 to bind the two. The polymer adhesive supporting layer 130 may be formed of any polymer materials suitable for adhering chips. In some embodiments, the polymer adhesive supporting layer 130 includes a thermal curing material, an ultraviolet curing material, or a combination thereof. In various embodiments, the polymer adhesive supporting layer 130 includes epoxy. In various embodiments, the polymer adhesive supporting layer 130 is a polymer dam structure. It is worth noting that the polymer adhesive supporting layer 130 is different from solder bumps generally used to connect a semiconductor chip and an interposer. The solder bumps are formed of specific alloys, and an eutectic bonding method is applied to perform transition between metal phases to make the alloys mix and diffuse under a melting point lower than that of any solutes. Thus, a metal interface bonding is formed between the semiconductor chip and the interposer at a lower temperature of about 400° C. to 500° C. However, it is not necessary to use the high temperature above to perform a polymer curing adhesive reaction of the polymer adhesive supporting layer 130. Generally, the highest temperature of the polymer curing adhesive reaction is under 300° C. to fully cure the polymer adhesive supporting layer 130, so as to perform its adhesive functionality. With selecting and controlling a composition ratio of the polymer adhesive supporting layer 130, the polymer adhesive supporting layer 130 may be formed even at a temperature under 200° C. to bind the semiconductor chip 110 and the interposer 120. Therefore, a binding process of the semiconductor chip 110 and the interposer 120 may be achieved under lower thermal budget, and thereby reducing a risk of high temperature effect on electronic devices in the chip package 100. Furthermore, when performing the eutectic bonding method, the demands on controlling parameters of an annealing process is high, such as temperature and heat cycles, so that small variations of a process easily make solder bumps generate mechanical stress to affect the metal interface bonding. Therefore, problems of failure connection and fracture may easily occur on the solder bumps between the semiconductor chip and the interposer. Relatively, it is much easier to control a curing reaction of the polymer adhesive supporting layer 130, and small variations of a process will not cause too much effect on the adhesive functionality of the polymer adhesive supporting layer 130. Thus, the polymer adhesive supporting layer 130 substitutes the solder bumps of the eutectic bonding method to make higher process margin of connecting the semiconductor chip 100 and the interposer 120 in the stereoscopic semiconductor chip package. Furthermore, it is effectively controlled to ensure the connection of the semiconductor chip 100 and the interposer 120. In addition, the polymer adhesive supporting layer 130 has lower costs of production, which make the chip package 100 of the present disclosure suitable for mass production. As shown in FIG. 2 and FIG. 3, in some embodiments, the polymer adhesive supporting layer 130 has an opening 132 through the through hole 124 to expose the conductive pad 116, which the opening 132 is formed by photolithography etching or laser drilling. Therefore, a conductive path between the semiconductor chip 110 and the interposer 120 is through the opening 132, so as to electrically connect the conductive pad 116 and the redistribution layer 140 at the sidewall 125 of the through hole 124. Continuing in FIG. 2 and FIG. 3, the redistribution layer 140 is disposed on the interposer 120 and in the through hole 124 to be electrically connected to the conductive pad 116. The redistribution layer 140 may be formed by suitable processes to overall deposit aluminum, copper, nickel, or other suitable conductive materials on the second isolation layer 180, and a patterning process is performed by photolithography etching, so as to remain the redistribution layer 140 having a predetermined pattern on the second isolation layer 180.

Continuing in FIG. 2 and FIG. 3, the packaging layer 150 is covered on the interposer 120 and the redistribution layer 140, which the packaging layer 150 has an opening 152 to expose the trench 122. The packaging layer 150 may be formed by coating solder mask or other suitable packaging materials conformally along the upper surface 123 of the interposer 120. As shown in FIG. 2 and FIG. 3, in some embodiments, the packaging layer 150 does not fully fill the through hole 124, and a contact surface between the packaging layer 150 and the redistribution layer 140 at the sidewall 125 of the through hole 124 is smaller to reduce stress accumulation between the packaging layer 150 and the redistribution layer 140 at the sidewall 125 of the through hole 124. Thus, it is avoided that the subsequent expansion or shrinkage of the packaging layer 150 affects the redistribution layer 140, and possibility of disconnection of the redistribution layer 140 is reduced to further improve the reliability of the chip package 100.

As shown in FIG. 2 and FIG. 3, in some embodiments, the chip package 100 further includes a conductive external connection 160 disposed on the interposer 120, which the conductive external connection 160 is electrically connected to the redistribution layer 140. The conductive external connection 160 may be formed of tin or other metals or alloys suitable for soldering. The conductive external connection 160 acts as a bridge between the chip package 100 and a printed circuit board or other interposers. Since the conductive pad 116 is electrically connected to the sensing device 112, current signals sensed by the sensing device 112 perform signal input/output control to input/output of the printed circuit board or other interposers via the conductive external connection 160, redistribution layer 140 and the conductive pad 116. Alternatively, input/output current signals of the printed circuit board or other interposers also perform signal input/output control to the sensing device 112 via the conductive external connection 160, redistribution layer 140 and the conductive pad 116. In some embodiments, the conductive external connection 160 is a solder ball. A method of manufacturing the semiconductor chip 100 of the present disclosure is described in following paragraphs and Figures.

Figure 4:
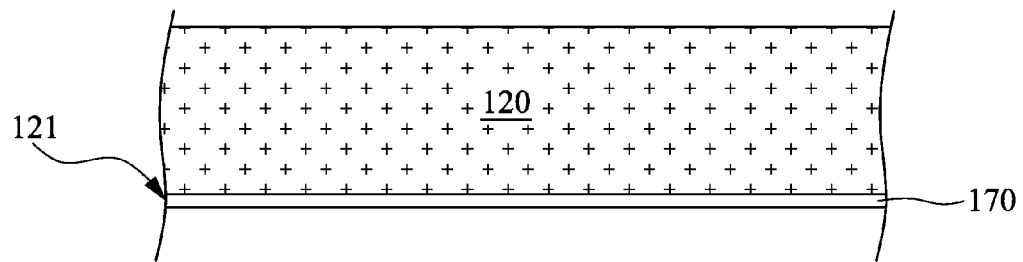
FIG. 4 is a cross-sectional view in a stage during manufacturing the chip package, according to various embodiments of the present disclosure.
Figure 5:
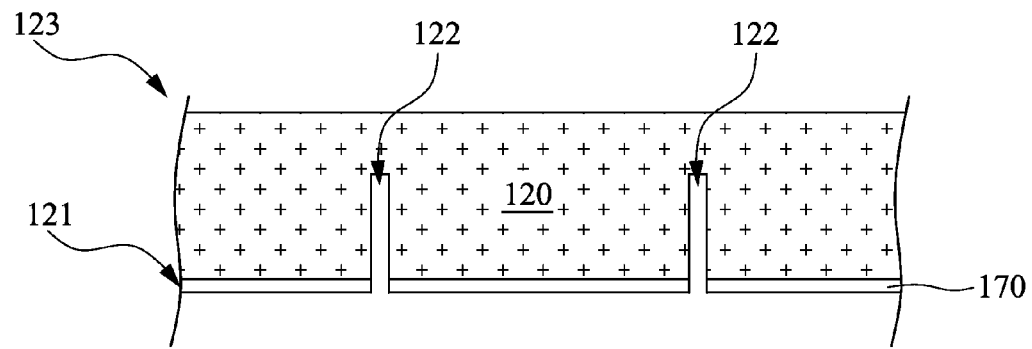
FIG. 5 is a cross-sectional view in next stage after FIG. 4 during manufacturing the chip package, according to various embodiments of the present disclosure.

FIG. 4 is a cross-sectional view in a stage during manufacturing the chip package, according to various embodiments of the present disclosure. FIG. 5 is a cross-sectional view in next stage after FIG. 4 during manufacturing the chip package, according to various embodiments of the present disclosure. Referring to FIG. 4, a first isolation layer 170 is formed at a lower surface 121 of the interposer 120, which may includes silicon. The first isolation layer 170 is formed by chemical vapor depositing silicon oxide, silicon nitride, silicon oxynitride, or other suitable insulating materials to form an isolation film conformally along the lower surface 121 of the interposer 120. Referring to FIG. 5, after forming the first isolation layer 170 at the lower surface 121 of the interposer 120, at least one trench 122 is formed to extend from the lower surface 121 to an upper surface 123 of the interposer 120. The trench 122 is a predetermined path through the interposer 120 to expose a sensing device 112 of a semiconductor chip 110 subsequently bound under the interposer 120, so as to generate sensing signals by sensing variation of temperature, pressure or acoustical wave.

Figure 6:
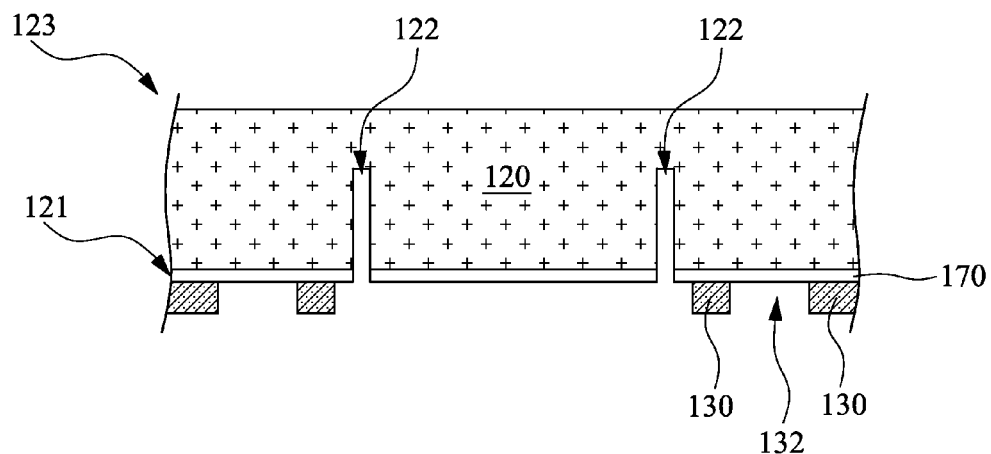
FIG. 6 is a cross-sectional view in next stage after FIG. 5 during manufacturing the chip package, according to various embodiments of the present disclosure.

FIG. 6 is a cross-sectional view in next stage after FIG. 5 during manufacturing the chip package, according to various embodiments of the present disclosure. As shown in FIG. 6, after forming the trench 122 extending from the lower surface 121 to the upper surface 123 of the interposer 120, a polymer adhesive supporting layer 130 is formed under the lower surface 121, and the polymer adhesive supporting layer 130 has an opening 132. The polymer adhesive supporting layer 130 may be formed of any polymer materials suitable for adhering chips. In some embodiments, the polymer adhesive supporting layer 130 includes a thermal curing material, an ultraviolet curing material, or a combination thereof. In various embodiments, the polymer adhesive supporting layer 130 includes epoxy. In various embodiments, the polymer adhesive supporting layer 130 is a polymer dam structure. It is worth noting that the polymer adhesive supporting layer 130 is different from solder bumps generally used to connect a semiconductor chip and an interposer. The solder bumps are formed of specific alloys, and an eutectic bonding method is applied to perform transition between metal phases to make the alloys mix and diffuse under a melting point lower than that of any solutes. Thus, a metal interface bonding is formed between the semiconductor chip and the interposer at a lower temperature of about 400° C. to 500° C. However, it is not necessary to use the high temperature above to perform a polymer curing adhesive reaction of the polymer adhesive supporting layer 130. Generally, the highest temperature of the polymer curing adhesive reaction is under 300° C. to fully cure the polymer adhesive supporting layer 130, so as to perform its adhesive functionality. Furthermore, when performing the eutectic bonding method, the demands on controlling parameters of an annealing process is high, such as temperature and heat cycles, so that small variations of the process easily make solder bumps generate mechanical stress to affect the metal interfacial bonding. Therefore, problems of failure connection and fracture may easily occur on the solder bumps between the semiconductor chip and the interposer. Relatively, it is much easier to control a curing reaction of the polymer adhesive supporting layer 130, and small variations of a process will not cause too much effect on the adhesive functionality of the polymer adhesive supporting layer 130. Thus, the polymer adhesive supporting layer 130 substitutes the solder bumps of the eutectic bonding method to make higher process margin of connecting the semiconductor chip 100 and the interposer 120 in the stereoscopic semiconductor chip package. Furthermore, it is effectively controlled to ensure the connection of the semiconductor chip 100 and the interposer 120. In addition, the polymer adhesive supporting layer 130 has lower costs of production, which make the chip package 100 of the present disclosure suitable for mass production. In some embodiments, forming the polymer adhesive supporting layer 130 at the lower surface 121 includes coating the polymer adhesive supporting layer 130 at the lower surface 121, and the polymer adhesive supporting layer 130 is photolithography etched to form an opening 132 in the polymer adhesive supporting layer 130. It is worth noting that the step of photolithography etching the polymer adhesive supporting layer 130 to form the opening 132 in the polymer adhesive supporting layer 130 is before a subsequent step of binding the semiconductor chip 110. In other words, the opening 132 of the polymer adhesive supporting layer 130 is formed before binding the semiconductor chip 110 and the polymer adhesive supporting layer 130, and the opening 132 of the polymer adhesive supporting layer 130 is corresponded to the conductive pad 116 when subsequently binding the semiconductor chip 110. As a result, the polymer adhesive supporting layer 130 is not in contact with the conductive pad 116 of the semiconductor chip 110, and it is not necessary to form an opening in the polymer adhesive supporting layer 130 to expose the conductive pad 116 subsequently, so as to effectively reduce possibility of damaging the conductive pad 116, which is caused by an opening process (e.g. photolithography etching process) of the polymer adhesive supporting layer 130. Thus, the reliability of the chip package 100 formed subsequently is further increased. In some embodiments, the polymer adhesive supporting layer 130 includes the thermal curing material, the ultraviolet curing material, or a combination thereof. In some embodiments, the thermal curing material includes epoxy. With selecting and controlling a composition ratio of the polymer adhesive supporting layer 130, the polymer adhesive supporting layer 130 may be formed even at a temperature under 200° C. to bind the semiconductor chip 110 and the interposer 120. Therefore, the binding process of the semiconductor chip 110 and the interposer 120 may be achieved under lower thermal budget, and thereby reducing a risk of high temperature effect on electronic devices in the chip package 100.

Figure 7:
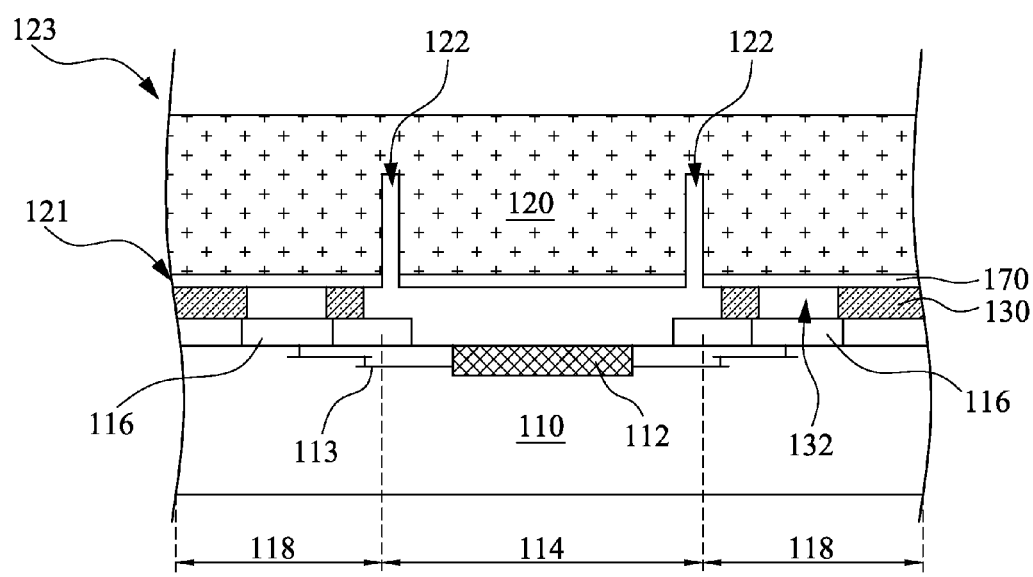
FIG. 7 is a cross-sectional view in next stage after FIG. 6 during manufacturing the chip package, according to various embodiments of the present disclosure.
Figure 8:
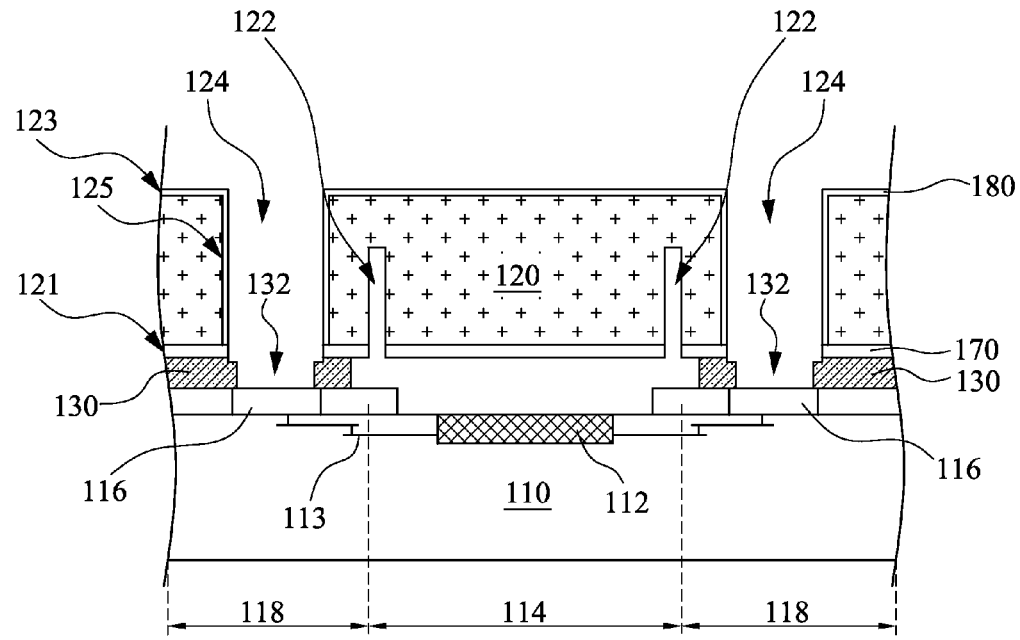
FIG. 8 is a cross-sectional view in next stage after FIG. 7 during manufacturing the chip package, according to various embodiments of the present disclosure.

FIG. 7 is a cross-sectional view in next stage after FIG. 6 during manufacturing the chip package, according to various embodiments of the present disclosure. As shown in FIG. 7, after forming the polymer adhesive supporting layer 130 under the lower surface 121, the interposer 120 and the semiconductor chip 110 are bound via the polymer adhesive supporting layer 130. The semiconductor chip 110 includes the sensing device 112 and the conductive pad 116 electrically connected to the sensing device 112, and the opening 132 of the polymer adhesive supporting layer 130 is corresponded to the conductive pad 116. Materials and connecting relationships of the semiconductor chip 110, the sensing device 112 and the conductive pad 116 are the same as aforementioned, and the details are not described herein. FIG. 8 is a cross-sectional view in next stage after FIG. 7 during manufacturing the chip package, according to various embodiments of the present disclosure. After binding the interposer 120 and the semiconductor chip 110 via the polymer adhesive supporting layer 130, a through hole 124 is formed to extend from the upper surface 123 to the lower surface 121, and the through hole 124 is through the opening 132 of the polymer adhesive supporting layer 130 to expose the conductive pad 116. The through hole may be through silicon via (TSV). As shown in FIG. 8, the through hole 124 is extended from the upper surface 123 to the lower surface 121 to expose the conductive pad 116, and a conductive path of the conductive pad 116 is subsequently formed in the through hole 124. In some embodiments, further includes a step of thinning the interposer 120 from the upper surface 123 to the lower surface 121. This step is between the step of binding the interposer 120 and the semiconductor chip 110 via the polymer adhesive supporting layer 130 and the step of forming the through hole 124 extending from the upper surface 123 to the lower surface 121 and through the opening 132 of the polymer adhesive supporting layer 130 to expose the conductive pad 116. For example, the interposer 120 is thinned from substantial 700 um to about substantial 200 um. Therefore, it is more efficient to form the through hole 124, and an overall thickness of the chip package 100 is much thinner. As shown in FIG. 8, after forming the through hole 124 extending from the upper surface 123 to the lower surface 121, a second isolation layer 180 is formed to cover the upper surface 123 and a sidewall 125 of the through hole 124. The second isolation layer 180 is formed by chemical vapor depositing silicon oxide, silicon nitride, silicon oxynitride, or other suitable insulating materials to form an isolation film conformally along the upper surface 123 of the interposer 120 and in the through hole 124.

Figure 9:
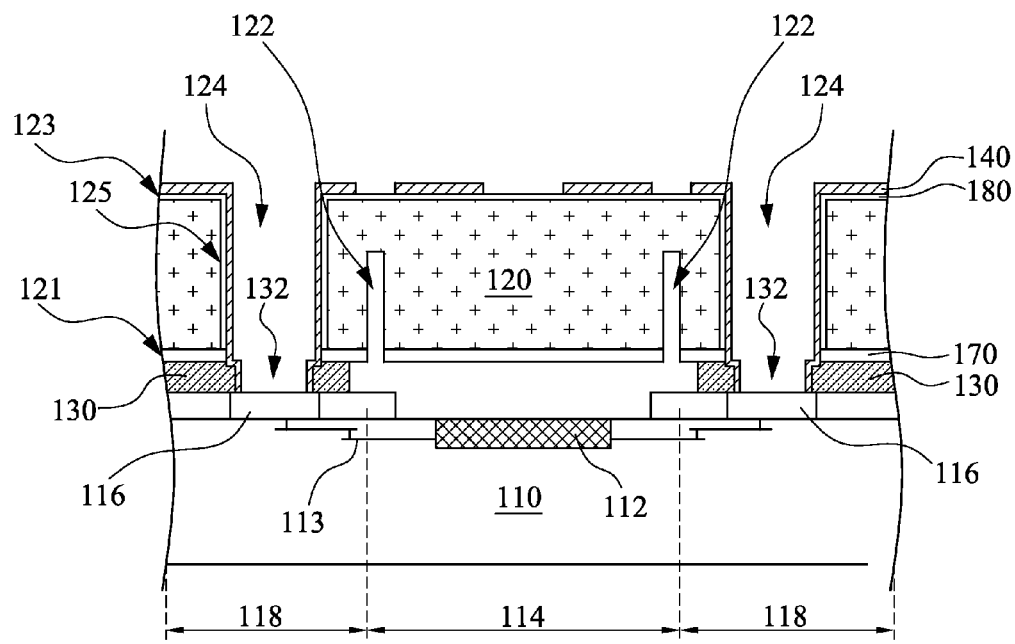
FIG. 9 is a cross-sectional view in next stage after FIG. 8 during manufacturing the chip package, according to various embodiments of the present disclosure.
Figure 10:
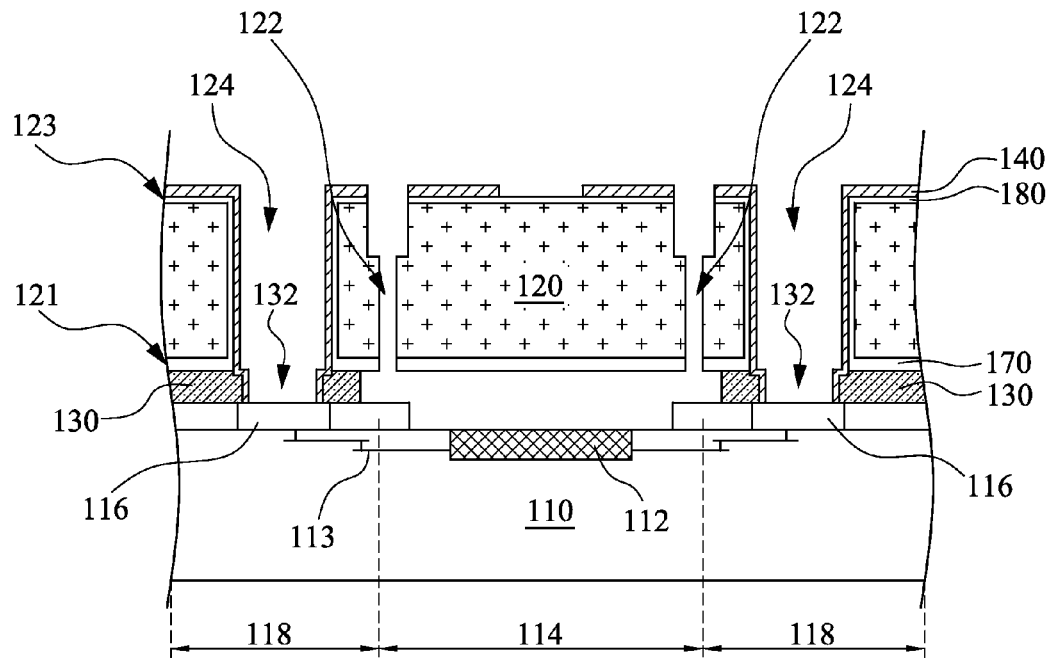
FIG. 10 is a cross-sectional view in next stage after FIG. 9 during manufacturing the chip package, according to various embodiments of the present disclosure.
Figure 11:
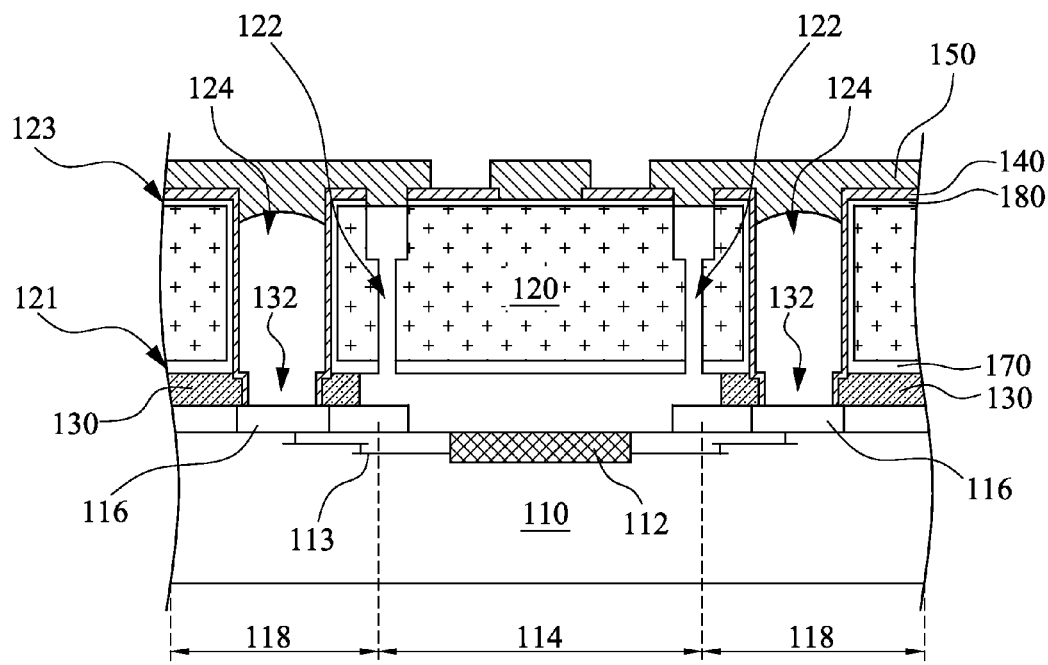
FIG. 11 is a cross-sectional view in next stage after FIG. 10 during manufacturing the chip package, according to various embodiments of the present disclosure.

FIG. 9 is a cross-sectional view in next stage after FIG. 8 during manufacturing the chip package, according to various embodiments of the present disclosure. A redistribution layer 140 is formed on the second isolation layer 180 and in the through hole 124 to be electrically connected to the conductive pad 116. The redistribution layer 140 may be formed by suitable processes to overall deposit aluminum, copper, nickel, or other suitable conductive materials on the second isolation layer 180, and a patterning process is performed by photolithography etching to remain the redistribution layer 140 having a predetermined pattern on the second isolation layer 180. FIG. 10 is a cross-sectional view in next stage after FIG. 9 during manufacturing the chip package, according to various embodiments of the present disclosure. The interposer 120 is etched to expose the trench 122 at the upper surface 123. Therefore, the trench 122 is through the interposer 120 to expose the sensing device 112 under the interposer 120, so as to generate sensing signals by sensing variation of temperature, pressure or acoustical wave, which the sensing device 112 is in the semiconductor chip 110. FIG. 11 is a cross-sectional view in next stage after FIG. 10 during manufacturing the chip package, according to various embodiments of the present disclosure. A packaging layer 150 is formed to cover the redistribution layer 140, and the packaging layer 150 has an opening 152 exposing the trench 122. In some embodiments, the packaging layer 150 may be formed by coating the packaging layer 150 on the redistribution layer 140. Then, the packaging layer 150 is laser drilled to form the opening 152 in the packaging layer 150 to expose the trench 122. In some embodiments, the packaging layer 150 does not fully fill the through hole 124 during coating the packaging layer 150 on the redistribution layer 140, and stress accumulation between the packaging layer 150 and the redistribution layer 140 at the sidewall 125 of the through hole 124 is reduced. Thus, it is avoided that the subsequent expansion or shrinkage of the packaging layer 150 affects the redistribution layer 140, and possibility of disconnection of the redistribution layer 140 is reduced to further improve the reliability of the chip package 100. As shown in FIG. 2, in some embodiments, a conductive external connection 160 is formed on the interposer 120, and the conductive external connection 160 is electrically connected to the redistribution layer 140. The conductive external connection 160 may be formed of tin or other metals or alloys suitable for soldering. The conductive external connection 160 acts as a bridge between the chip package 100 and a printed circuit board or other interposers. Since the conductive pad 116 is electrically connected to the sensing device 112, current signals sensed by the sensing device 112 perform signal input/output control to input/output of the printed circuit board or other interposers via the conductive external connection 160, redistribution layer 140 and the conductive pad 116. Alternatively, input/output current signals of the printed circuit board or other interposers also perform signal input/output control to the sensing device 112 via the conductive external connection 160, redistribution layer 140 and the conductive pad 116. Therefore, the chip package 100 shown in FIG. 2 is formed. In some embodiments, the conductive external connection 160 is a solder ball.

Finally, it is worth emphasizing that, the present disclosure provides a chip package having a polymer adhesive supporting layer to substitute solder bumps of an eutectic bonding method. Therefore, higher process margin of connecting a semiconductor chip and an interposer in a stereoscopic semiconductor chip package is achieved, which is effectively controlled to ensure the connection of the semiconductor chip and the interposer. In addition, the polymer adhesive supporting layer is effectively formed under lower temperature, and thereby reducing a risk of high temperature effect on electronic devices in the chip package. Also, the polymer adhesive supporting layer has lower costs of production, which make the chip package of the present disclosure suitable for mass production.

Although the present invention has been described in considerable detail with reference to certain embodiments thereof, other embodiments are possible. Therefore, the spirit and scope of the appended claims should not be limited to the description of the embodiments contained herein. Reference

What is claimed is:

1. A chip package, comprising:
   a semiconductor chip having at least one sensing device and at least one conductive pad electrically connected to the at least one sensing device;
   an interposer disposed on the semiconductor chip, the interposer having at least one trench and at least one through hole, the trench penetrating the interposer, and the through hole exposing the conductive pad;
   a polymer adhesive supporting layer interposed between the semiconductor chip and the interposer;
   a redistribution layer disposed on the interposer and in the through hole to be electrically connected to the conductive pad; and
   a packaging layer covering the interposer and the redistribution layer, the packaging layer having an opening exposing the trench.

2. The chip package of claim 1, wherein the polymer adhesive supporting layer has an opening connected to the through hole to expose the conductive pad.

3. The chip package of claim 1, wherein the polymer adhesive supporting layer comprises a thermal curing material, an ultraviolet curing material, or a combination thereof.

4. The chip package of claim 3, wherein the polymer adhesive supporting layer comprises epoxy.

5. The chip package of claim 1, wherein the at least one sensing device is disposed in an active region of the semiconductor chip, the conductive pad being disposed in a periphery region of the semiconductor chip, and the periphery region surrounding the active region.

6. The chip package of claim 1, wherein the packaging layer does not fully fill the through hole.

7. The chip package of claim 1, further comprising a conductive external connection disposed on the interposer, and the conductive external connection being electrically connected to the redistribution layer.

8. The chip package of claim 1, wherein the interposer comprises:
   a first isolation layer disposed at a lower surface of the interposer; and
   a second isolation layer disposed at an upper surface of the interposer and at a sidewall of the through hole.

9. The chip package of claim 5, wherein a projection of the trench on the semiconductor chip is in at least one side of the active region.

10. The chip package of claim 1, wherein the polymer adhesive supporting layer is a polymer dam structure.

11. A method of manufacturing a chip package, comprising:
    forming a first isolation layer at a lower surface of an interposer;
    forming at least one trench extending in a direction from the lower surface to an upper surface of the interposer;
    forming a polymer adhesive supporting layer under the lower surface, and the polymer adhesive supporting layer having an opening;
    binding the interposer and a semiconductor chip via the polymer adhesive supporting layer, the semiconductor chip having at least one sensing device and at least one conductive pad electrically connected to the at least one sensing device, and the opening of the polymer adhesive supporting layer corresponding to the conductive pad;
    forming at least one through hole extending from the upper surface to the lower surface and through the opening of the polymer adhesive supporting layer to expose the conductive pad;
    forming a second isolation layer covering the upper surface and a sidewall of the through hole;
    forming a redistribution layer on the second isolation layer and in the through hole to be electrically connected to the conductive pad;
    etching the interposer to expose the trench at the upper surface; and
    forming a packaging layer covering on the redistribution layer, and the packaging layer having an opening exposing the trench.

12. The method of manufacturing the chip package of claim 11, wherein forming the polymer adhesive supporting layer at the lower surface comprises:
    coating the polymer adhesive supporting layer at the lower surface; and
    photolithography etching the polymer adhesive supporting layer to form the opening in the polymer adhesive supporting layer.

13. The method of manufacturing the chip package of claim 12, further comprising:
    thinning the interposer from the upper surface between the step of binding the interposer and the semiconductor chip via the polymer adhesive supporting layer and the step of forming the through hole extending from the upper surface to the lower surface and through the opening of the polymer adhesive supporting layer to expose the conductive pad.

14. The method of manufacturing the chip package of claim 11, wherein forming the packaging layer covering on the redistribution layer comprises:
    coating the packaging layer on the redistribution layer; and
    laser drilling the packaging layer to form the opening in the packaging layer to expose the trench.

15. The method of manufacturing the chip package of claim 14, wherein the packaging layer does not fully fill the through hole during coating the packaging layer on the redistribution layer.

16. The method of manufacturing the chip package of claim 11, wherein the polymer adhesive supporting layer comprises a thermal curing material, an ultraviolet curing material, or a combination thereof.

17. The method of manufacturing the chip package of claim 16, wherein the thermal curing material comprises epoxy.

18. The method of manufacturing the chip package of claim 11, further comprising:
    forming a conductive external connection on the interposer, and the conductive external connection being electrically connected to the redistribution layer.

19. The method of manufacturing the chip package of claim 11, wherein the polymer adhesive supporting layer is a polymer dam structure.

* * * * *